(12) United States Patent
Zheng et al.

(10) Patent No.: US 11,862,678 B2
(45) Date of Patent: Jan. 2, 2024

(54) ELECTRICAL ISOLATION IN PIXEL-ARRAY SUBSTRATES USING COMBINATION OF DOPED SEMICONDUCTOR GUARD RINGS AND OVERLAPPING ISOLATION TRENCHES

(71) Applicant: OmniVision Technologies, Inc., Santa Clara, CA (US)

(72) Inventors: Yuanwei Zheng, San Jose, CA (US); Sing-Chung Hu, San Jose, CA (US); Gang Chen, San Jose, CA (US); Dyson Tai, San Jose, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 487 days.

(21) Appl. No.: 16/905,625

(22) Filed: Jun. 18, 2020

(65) Prior Publication Data
US 2021/0399093 A1 Dec. 23, 2021

(51) Int. Cl.
*H01L 27/146* (2006.01)
*H01L 29/06* (2006.01)

(52) U.S. Cl.
CPC ...... *H01L 29/0653* (2013.01); *H01L 27/1463* (2013.01); *H01L 27/14612* (2013.01); *H01L 27/14643* (2013.01); *H01L 27/14689* (2013.01)

(58) Field of Classification Search
CPC ........... H01L 27/1463; H01L 27/14643; H01L 27/14689
See application file for complete search history.

(56) References Cited

U.S. PATENT DOCUMENTS

| 6,049,118 A * | 4/2000 | Nagano ............. H01L 31/02024 |
| | | 257/555 |
| 9,613,916 B2 * | 4/2017 | Tsai ................ H01L 27/14607 |
| 2016/0099278 A1 | 4/2016 | Guyader et al. |
| 2018/0061875 A1 | 3/2018 | Roy |

(Continued)

FOREIGN PATENT DOCUMENTS

WO    WO-2019155782 A1 *   8/2019   .......... H01L 27/146

OTHER PUBLICATIONS

U.S. Appl. No. 16/905,670 Non-Final Office Action dated May 5, 2022, 8 pages.

*Primary Examiner* — Anh D Mai
(74) *Attorney, Agent, or Firm* — COZEN O'CONNOR

(57) ABSTRACT

A pixel-array substrate includes a semiconductor substrate with a pixel array, a back surface, and a front surface, and a guard ring formed of a doped semiconductor, enclosing the pixel array, and extending into the semiconductor substrate from the front surface, the back surface forming a trench extending into the semiconductor substrate, the trench overlapping the guard ring. A method for reducing leakage current into a pixel-array includes doping a semiconductor substrate to form a guard ring that extends into the semiconductor substrate from a front surface, encloses a pixel array, excludes a periphery region, and resists a flow of electric current, and forming, into a back surface of the semiconductor substrate, a trench that penetrates into the back surface and overlaps the guard ring, the guard ring and the trench configured to resist the flow of electric current between the pixel array and the periphery region.

8 Claims, 10 Drawing Sheets

(56) References Cited

U.S. PATENT DOCUMENTS

| | | | |
|---|---|---|---|
| 2018/0174888 A1 | 6/2018 | Chou et al. | |
| 2019/0148427 A1* | 5/2019 | Lee | H01L 27/14607 257/446 |
| 2022/0208808 A1* | 6/2022 | Kwag | H01L 27/14623 |

* cited by examiner

600

610
DOPE A SEMICONDUCTOR SUBSTRATE TO FORM A GUARD RING THAT EXTENDS INTO THE SEMICONDUCTOR SUBSTRATE FROM A FRONT SURFACE, ENCLOSES A PIXEL ARRAY, EXCLUDES A PERIPHERY REGION, AND RESISTS A FLOW OF ELECTRIC CURRENT

614
DOPING THE SEMICONDUCTOR SUBSTRATE WITH A P-TYPE DOPANT

620
FORM, INTO A BACK SURFACE OF THE SEMICONDUCTOR SUBSTRATE, A TRENCH THAT PENETRATES INTO THE BACK SURFACE AND OVERLAPS THE GUARD RING, THE BACK SURFACE OPPOSITE THE FRONT SURFACE, THE GUARD RING AND THE TRENCH ARE CONFIGURED TO RESIST THE FLOW OF ELECTRIC CURRENT BETWEEN THE PIXEL ARRAY AND THE PERIPHERY REGION

622
ETCH THE BACK SURFACE UNTIL THE TRENCH EXTENDS INTO THE GUARD RING

624
COAT THE TRENCH WITH A HIGH-K PASSIVATION LAYER

626
FILL THE TRENCH WITH AN OXIDE

*FIG. 6*

ELECTRICAL ISOLATION IN PIXEL-ARRAY SUBSTRATES USING COMBINATION OF DOPED SEMICONDUCTOR GUARD RINGS AND OVERLAPPING ISOLATION TRENCHES

BACKGROUND

Camera modules in commercial products such as stand-alone digital cameras, mobile devices, automotive components, and medical devices include an image sensor. The image sensor includes a pixel-array substrate, which includes a pixel array and a periphery region surrounding the pixel array. Image sensors also include additional analog devices in the periphery region that are used to connect the image sensor, or to control the pixel array. In practice, electrical leakage current flows between regions of the semiconductor substrate and causes unwanted effects such as noise that reduces image quality and reduced functionality of the image sensor.

SUMMARY OF THE EMBODIMENTS

Semiconductors substrates, like those used in pixel-array substrates, can conduct electrical current. During use of an image sensor, current that flows between the pixel array and the periphery region can lead to noise that thereby reduces image quality or resolution of the image sensor. Guard rings are used to reduce the flow of leakage current across the pixel-array substrate. Guard rings are formed by doping regions of the of pixel-array substrate. In conventional back-side illuminated (BSI) photodetectors, guard rings are often formed from the front side of the pixel-array substrate. For image sensors with small pixels, the pixels are formed from the front side and are often relatively deep. Achieving full well capacity of the pixels requires high doping concentration within the semiconductor substrate. In such deep photodetectors, it is difficult to maintain good electrical isolation between regions of the pixel-array substrate, such as between pixels or between the pixel array and the periphery region because of the challenges in forming guard rings that extend deep enough into the semiconductor substrate. Electrical isolation can also be a problem between two or more regions of within the periphery region. Analog devices in the periphery region, such as capacitors, require two regions of the semiconductor substrate to maintain a voltage difference between them. The voltage difference is difficult to maintain if the two regions are not sufficiently electrically isolated.

Embodiments disclosed here help augment electrical isolation by combining guard rings with deep trench isolation formed on the backside of the pixel-array substrate. Deep trench isolation serves to prevent the flow of electric current across the pixel-array substrate at depths within the substrate that the guard ring does not reach. Rather than extending the guard ring deeper into the substrate from the front face, which requires costly lithographic processes, use of deep trench isolation prevents leakage current by removing material from the substrate and replacing it with electrical insolation. This combined isolation that uses a guard ring and deep trench isolation can be used to prevent flow of current i) between the pixel array from the periphery region and ii) between two regions of the periphery region, specifically between two regions having different supplied voltages as part of an analog device.

In an embodiment, a pixel-array substrate includes a semiconductor substrate that includes a pixel array, a back surface, and a front surface opposite the back surface; and a guard ring being formed of a doped semiconductor, enclosing the pixel array, and extending into the semiconductor substrate from the front surface, the back surface forming a trench that extends into the semiconductor substrate and overlaps the guard ring.

In an embodiment, a method for reducing leakage current into a pixel-array of a pixel-array substrate includes: doping a semiconductor substrate to form a guard ring that extends into the semiconductor substrate from a front surface, encloses a pixel array, excludes a periphery region, and resists a flow of electric current; and forming, into a back surface of the semiconductor substrate, a trench that penetrates into the back surface and overlaps the guard ring, the back surface opposite the front surface, the guard ring and the trench are configured to resist the flow of electric current between the pixel array and the periphery region.

In an embodiment, a method for reducing leakage current across a pixel-array substrate includes: doping a semiconductor substrate to form a guard ring that extends into the semiconductor substrate from a front surface, encloses a first region of the semiconductor substrate, excludes a second region of the semiconductor substrate, and resists a flow of electric current when the first region is supplied with a first voltage and the second region is supplied with a second voltage; and forming, into a back surface of the semiconductor substrate, a trench that penetrates into the back surface and overlaps the guard ring, the back surface opposite the front surface, the guard ring and the trench configured to resist the flow of electric current between the first region and the second region.

BRIEF DESCRIPTION OF THE FIGURES

FIG. 6 illustrates one method for reducing leakage current between a pixel-array and a periphery region of a pixel-array substrate, according to an embodiment.

DETAILED DESCRIPTION OF THE EMBODIMENTS

Figure 1:
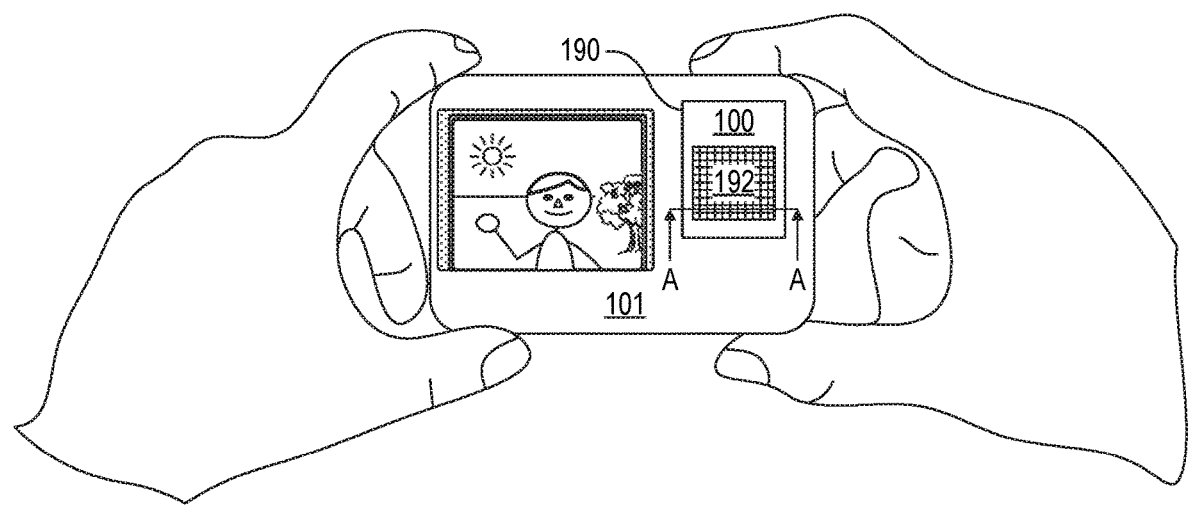
FIG. 1 depicts a camera imaging a scene.

FIG. 1 depicts a camera 101 imaging a scene. Camera 101 includes an image sensor 190, which includes a pixel-array substrate 100. Constituent elements of pixel-array substrate 100 may include at least one of silicon and germanium. Pixel-array substrate 100 includes a pixel array 192. Image sensor 190 may part of a chip-scale package or a chip-on-board package.

Figure 2:
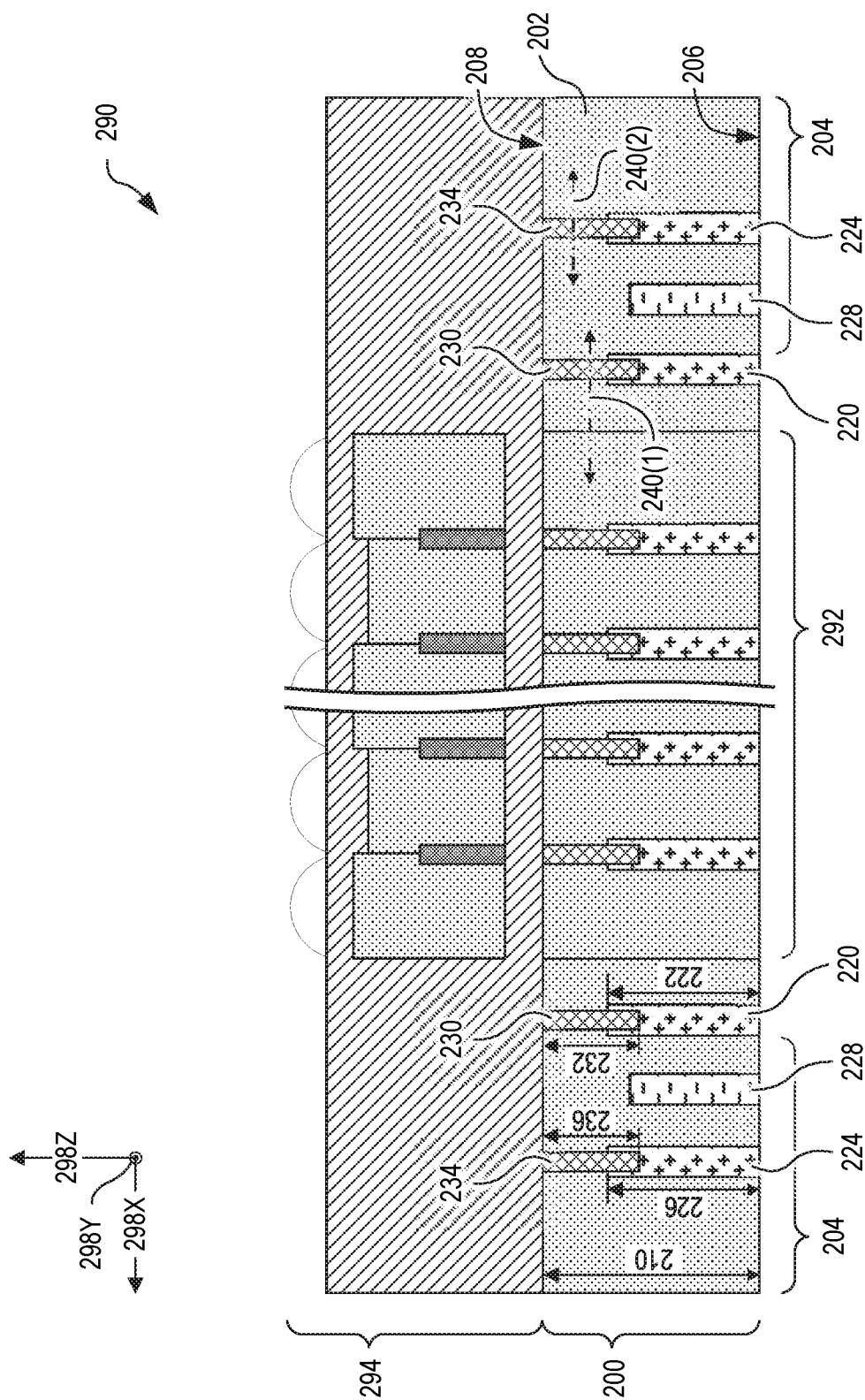
FIG. 2 illustrates a cross-sectional side view of a pixel-array substrate with electrical isolation including guard rings and trenches to reduce leakage current across a semiconductor substrate, according to an embodiment.
Figure 3:
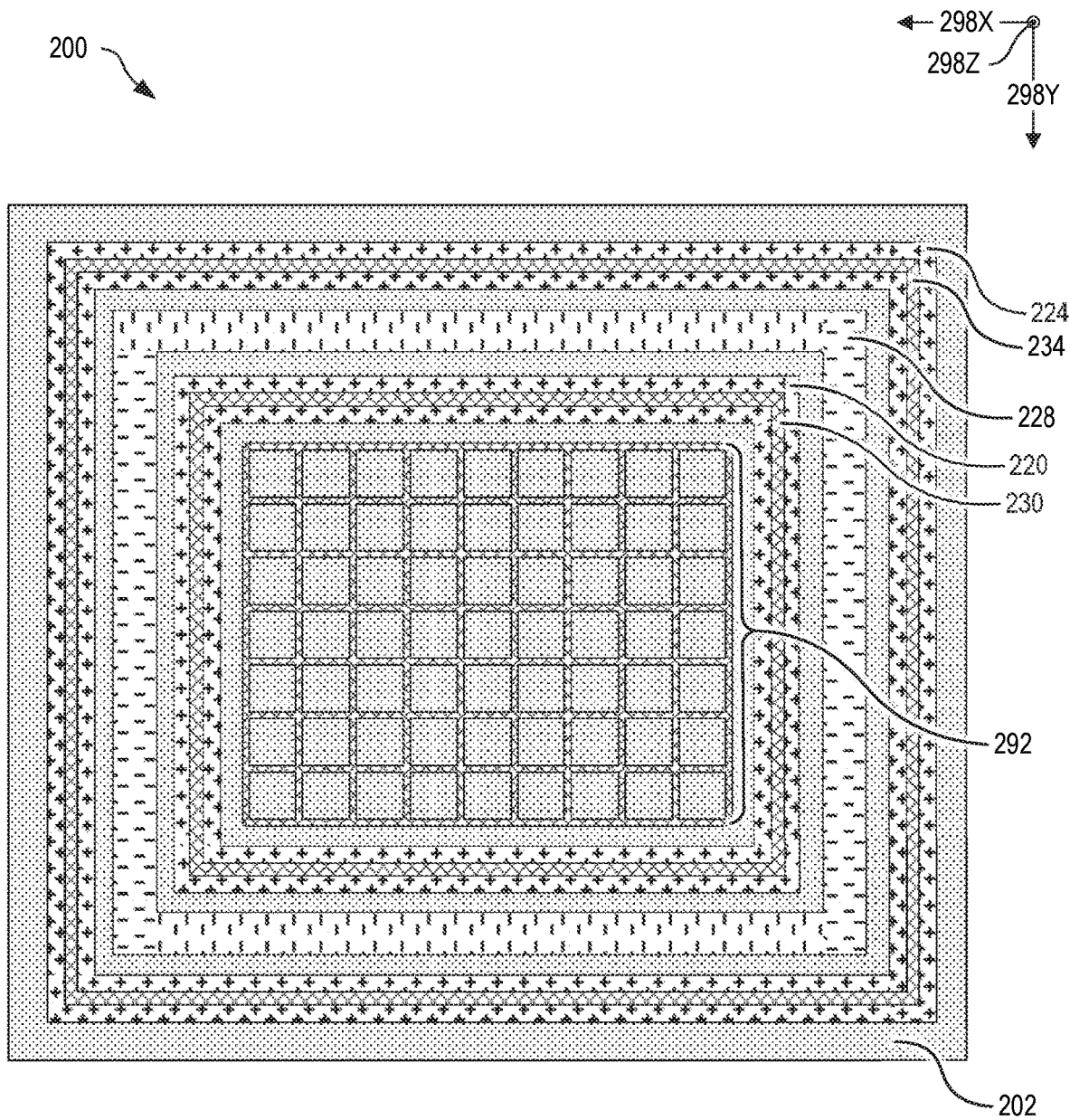
FIG. 3 illustrates a cross-sectional top view of the pixel-array substrate of FIG. 2, according to an embodiment.

FIG. 2 and FIG. 3 illustrates respective cross-sectional views of an image sensor 290 with pixel-array substrate 200, which are examples of image sensor 190 and pixel-array substrate 100, respectively. FIG. 2 and FIG. 3 are best viewed together. The location of the cross-section illustrated in FIG. 2 is equivalent to the section line A-A in FIG. 1. The cross section illustrated in FIG. 2 is parallel to a plane, hereinafter the x-z plane, formed by orthogonal axes 298X and 298Z, which are each orthogonal to an axis 298Y. The cross section illustrated in FIG. 3 is parallel to a plane, hereinafter the x-y plane, formed by orthogonal axes 298X and 298Y, and planes parallel to the x-y plane are referred to as horizontal planes. Unless otherwise specified, heights of objects herein refer to the object's extent along axis 298Z. Herein, a reference to an axis x, y, or z refers to axes 298X, 298Y, and 298Z respectively. Also, herein, a width refers to an object's extent along the y axis, and vertical refers to a direction along the z axis. Also, herein, above refers to a relative position a distance away along the axis 298Z in the positive direction and below refers to a relative position a distance away along the axis 298Z in the negative direction The pixel-array substrate 200 includes electrical isolation including guard ring 220, second guard ring 224, third guard ring 228, trench 230, and second trench 234 to resist a of leakage currents (240(1) and 240(2)) across the pixel-array substrate 200, according to an embodiment. The image sensor 290 also includes a pixel array 292 and an optics layer 294. The pixel-array substrate 200 includes a front surface 206, a back surface 208, and a periphery region 204 that surrounds the pixel array 292 in the horizontal plane. The front surface 206 is opposite the back surface 208 and the two are separated by a substrate thickness 210. The pixel-array substrate 200 is formed in a semiconductor substrate 202, which may include silicon, silicon-germanium, germanium, gallium arsenide, and combinations thereof.

A guard ring 220 is formed of a doped semiconductor, extends into the semiconductor substrate 202 from the front surface 206, and encloses the pixel array 292 in the horizontal plane. The guard ring 220 increases the electrical resistance of a charge carrier (not shown) through the guard ring 220. In the embodiment illustrated in FIG. 2, the guard ring 220 resists the flow of electrical current through the guard ring 220 in the direction along the x axis for the portion of the pixel-array substrate 200 shown. In general, the guard ring 220 illustrated in FIG. 2 resists the flow of electrical current through the guard ring 220 along directions included in the horizontal plane. By enclosing the pixel array 292, guard ring 220 resists the flow of electrical current between the pixel array 292 and the periphery region 204.

Formed into the back surface 208 of the semiconductor substrate 202 is a trench 230. In some embodiments, the trench 230 is coated with a high-κ passivation layer (not shown) and filled with an oxide (not shown) that both serve to further resist the flow of electric current across the trench 230. The trench 230 overlaps the guard ring 220 in the horizontal plane. The trench 230 limits the flow of electrical current through the semiconductor along directions included in the horizontal plane by removing material of the semiconductor substrate 202 through which charge carriers could otherwise flow. The trench 230 extends into the semiconductor substrate 202 to a trench depth 232 and the guard ring 220 extends into the semiconductor substrate to a ring depth 222. In the embodiment illustrated in FIG. 2, the trench depth 232 and the ring depth 222 combined are greater than the substrate thickness 210, which causes the trench 230 and the guard ring 220 to overlap along the z axis. In the embodiment illustrated in FIG. 2, electrical current is resisted across the guard ring 220 and trench 230 through the semiconductor along directions included in the horizontal plane at all vertical extents within the semiconductor substrate 202, either by the guard ring 220, the trench 230, or a combination of both. Ring depth 222 and trench depth 232 may be increased or decreased and the combined length of the two may also be increased or decreased without departing from the scope hereof.

In an embodiment, the guard ring 220 is formed of a p-doped semiconductor, as is known in the art.

In an embodiment, the pixel-array substrate 200 further includes a second guard ring 224 that is formed of a doped semiconductor, extends into the semiconductor substrate 202 from the front surface 206, and encloses the guard ring 220 in the horizontal plane. The second guard ring 224 increases the electrical resistance of the charge carrier (not shown) through the second guard ring 224. In the embodiment illustrated in FIG. 2, the second guard ring 224 resists the flow of electrical current through the second guard ring 224 in the direction along the x axis for the portion of the pixel-array substrate 200 shown.

Formed into the back surface 208 of the semiconductor substrate 202 is a second trench 234. In some embodiments, the second trench 234 is coated with a high-κ passivation layer (not shown) and filled with an oxide (not shown) that both serve to further resist the flow of electric current across the trench 230. The second trench 234 overlaps the second guard ring 224 in the horizontal plane. The second trench 234 limits the flow of electrical current through the semiconductor along directions included in the horizontal plane by removing material of the semiconductor substrate 202 through which charge carriers could otherwise flow. The second trench 234 extends into the semiconductor substrate 202 to a second trench depth 236 and the second guard ring 224 extends into the semiconductor substrate to a second ring depth 226. In the embodiment illustrated in FIG. 2, the second trench depth 236 and the second ring depth 226 combined are greater than the substrate thickness 210, which causes the second trench 234 and the second guard ring 224 to overlap along the z axis. In the embodiment illustrated in FIG. 2, electrical current is reduced across the second guard ring 224 and second trench 234 through the semiconductor along directions included in the horizontal plane at all vertical extents within the semiconductor substrate 202, either by the second guard ring 224, the second trench 234, or a combination of both. The second ring depth 226 and second trench depth 236 may be increased or decreased and the combined length of the two may also be increased or decreased without departing from the scope herein.

In an embodiment, the second guard ring 224 is formed of a p-doped semiconductor, as is known in the art.

In an embodiment, the pixel-array substrate 200 further includes a third guard ring 228 that is formed of a doped semiconductor, extends into the semiconductor substrate 202 from the front surface 206, encloses the guard ring 220 in the horizontal plane, and excludes the second guard ring 224 in the horizontal plane. The combination of the guard ring 220, the second guard ring 224 and the third guard ring 228 effectively prevent the flow of electric current through the semiconductor substrate 202. In an embodiment, the third guard ring 228 is formed by doping the semiconductor substrate 202 to form a n-doped semiconductor material, as is known in the art. In an embodiment, the third guard ring 228 is supplied a voltage that further serves to prevent the flow of current across the third guard ring 228.

Figure 4:
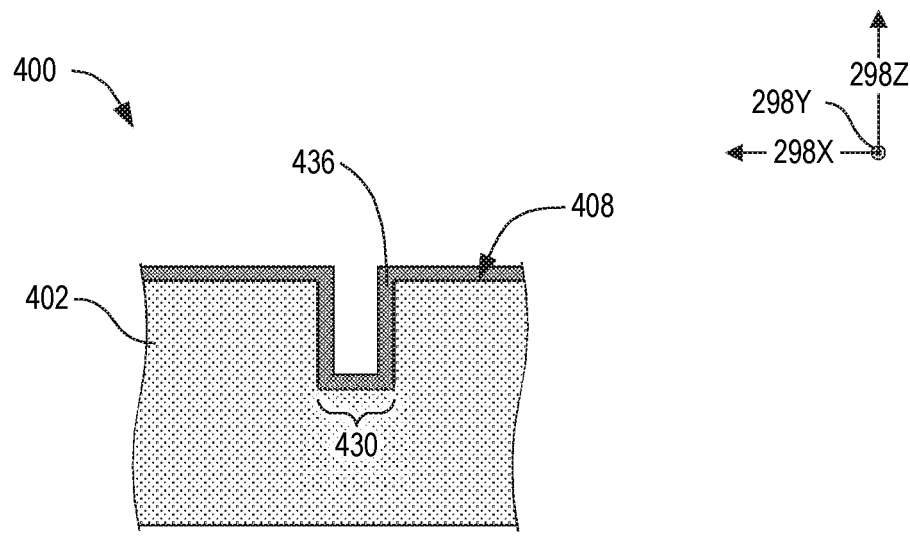
FIG. 4 illustrates a pixel-array substrate with a back surface of a semiconductor substrate that is coated with a high-κ passivation layer that lines a trench, according to an embodiment.

FIG. 4 illustrates one pixel-array substrate 400 with a back surface 408 of a semiconductor substrate 402 that is coated with a high-κ passivation layer 436 that lines a trench 430. The pixel-array substrate 400 is an example of the pixel-array substrate 200 including only certain components from the description of FIG. 2. The back surface 408, the semiconductor substrate 402, and the trench 430 are examples of the back surface 208, semiconductor substrate 202 and trench 230/second trench 234 of FIG. 2, respectively, and the descriptions of each respective element apply between the two figures.

Figure 5:
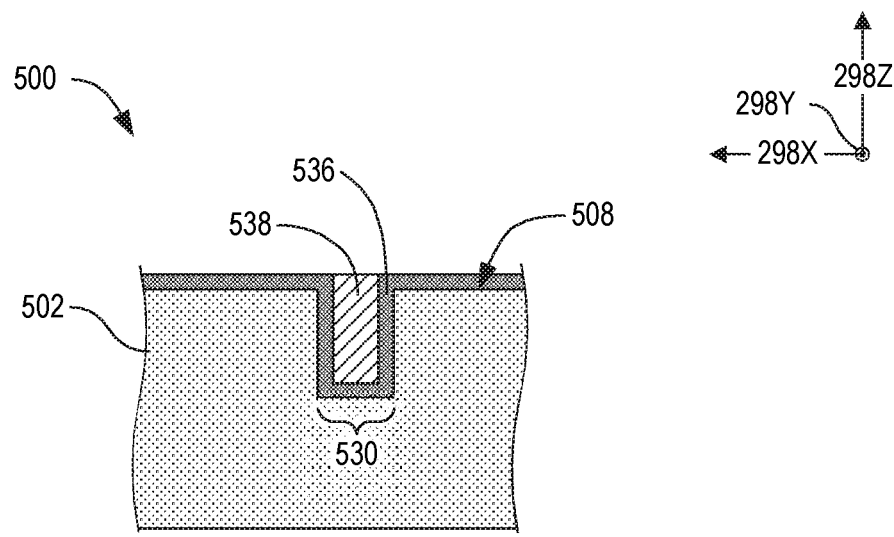
FIG. 5 illustrates one pixel-array substrate with a back surface of a semiconductor substrate that is coated with a high-κ passivation layer that lines a trench and with an oxide that fills the trench, according to an embodiment.

FIG. 5 illustrates one pixel-array substrate 500 with a back surface 508 of a semiconductor substrate 502 that is coated with a high-κ passivation layer 536 that lines a trench 530 and with an oxide 538 that fills the trench 530. Inside the trench 530 is the oxide 538 that further resists the flow of electric current (not shown) through the trench 530. The pixel-array substrate 500 is an example of the pixel-array substrate 200 including only certain components from the description of FIG. 2. The back surface 508, semiconductor substrate 502, and trench 530 are examples of the back surface 208, the semiconductor substrate 202 and the trench 230/second trench 234 of FIG. 2, respectively, and the descriptions of each respective element apply between the two figures.

FIG. 6 is a flowchart illustrating a method 600 for reducing leakage current between a pixel-array and a periphery region of a pixel-array substrate. Method 600 may be used in conjunction with any of pixel-array substrates 200, 400, or 500. Method 600 includes blocks 610 and 620. In embodiments, method 600 also includes at least one of blocks 624 and 626.

In block 610 of method 600, a semiconductor substrate is doped to form a guard ring that extends into the semiconductor substrate from a front surface, encloses a pixel array, excludes a periphery region, and resists a flow of electric current. In one example of block 610, the semiconductors substrate 202 is doped to form a guard ring 220.

In block 620 of method 600, into a back surface of the semiconductor substrate, a trench is formed that penetrates into the back surface and overlaps the guard ring, the back surface opposite the front surface, the guard ring and the trench are configured to resist the flow of electric current between the pixel array and the periphery region. In one example of block 620, the trench 230 is formed into the back surface 208 of the semiconductor substrate. In one example of block 620, the trench 430/530 is formed into the back surface 408/508.

Figure 7:
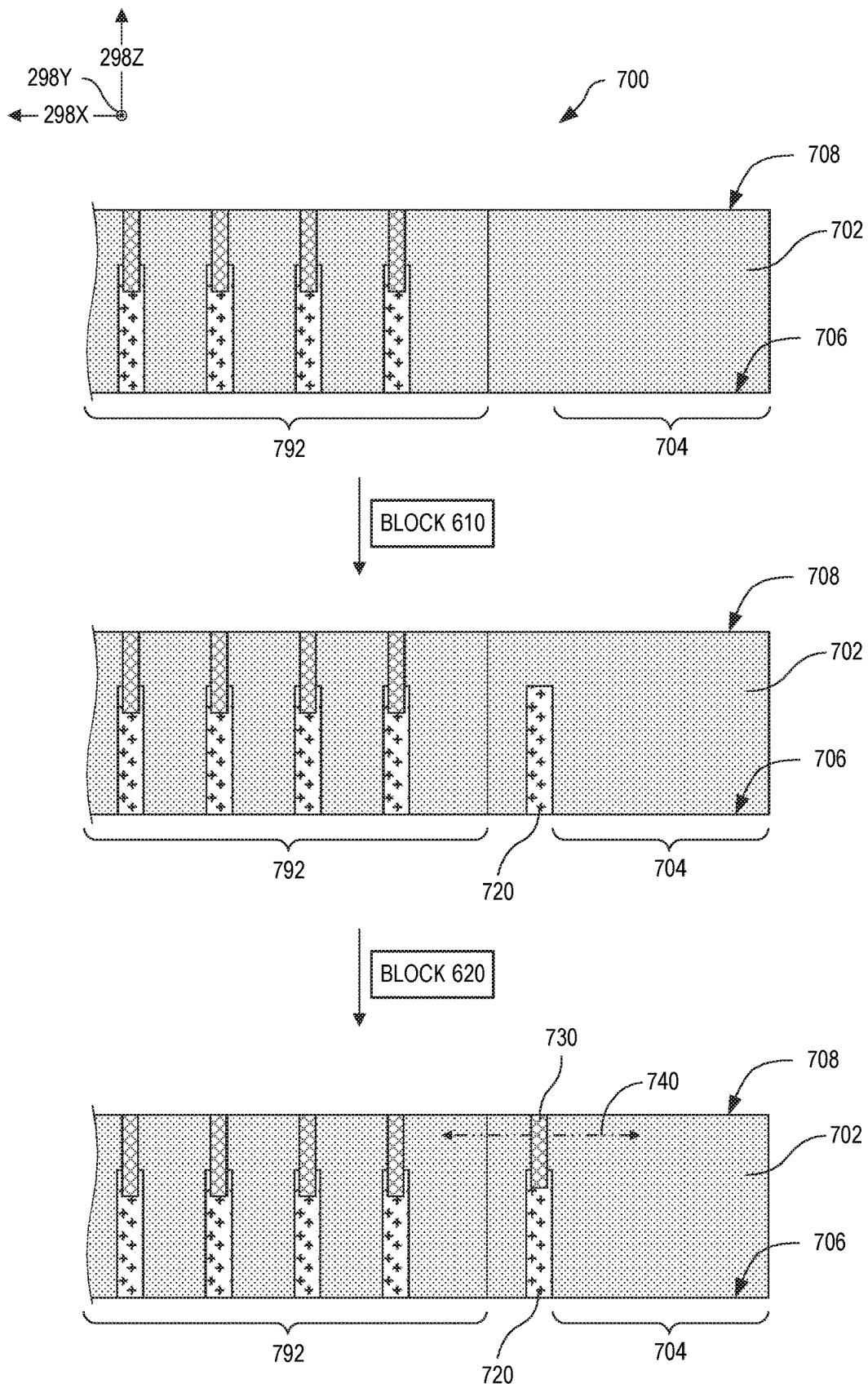
FIG. 7 illustrates one pixel-array substrate and intermediate substrates that result from the method of FIG. 6, according to an embodiment.

FIG. 7 shows cross-sectional views of semiconductor substrate 702, the views illustrating blocks of the method 600. Using block 610, semiconductor substrate 702 of pixel-array substrate 700 is doped to form a guard ring 720 that extends into the semiconductor substrate 702 from a front surface 706, encloses a pixel array 792, and excludes a periphery region 704. Using block 620, the back surface 708 of the semiconductor substrate 702 is etched to form a trench 730 that penetrates into the back surface 708 and overlaps the guard ring 720 in the horizontal plane. The back surface 708 is opposite the front surface 706 and the guard ring 720 combined with the trench 730 are configured to resist the flow of electric current 740 between the pixel array 792 and the periphery region 704.

In certain embodiments, the method 600 includes one or more additional blocks of the flowchart in FIG. 6. In block 614 of method 600, the semiconductor substrate is doped with a p-type dopant when forming the guard ring. In one example of block 614, guard ring 220 is formed by doping the semiconductor substrate 202 with a p-type dopant (not shown).

FIG. 7 illustrates one example of block 614 of method 600. In this example, the semiconductor substrate 702 of a pixel-array substrate 700 is doped with a p-type dopant to form the guard ring 720, as is known in the art.

In certain embodiments, the method 600 includes one or more additional blocks of the flowchart in FIG. 6. In block 622 of method 600, the back surface of the semiconductor is etched until the trench extends into the guard ring. In one example of block 622, the back surface 208 of the semiconductor substrate 202 is etched until the trench 230 extends into the guard ring 220. In one example of block 622, the back surface 408/508 is etched until the trench 430/530 respectively extends into the guard ring (not shown).

FIG. 7 illustrates one example of block 622 of method 600. In this example, the back surface 708 is etched until the trench 730 extends into the guard ring 720.

In certain embodiments, the method 600 includes one or more additional blocks of the flowchart in FIG. 6 that serve to further resist the flow of unwanted electric current though the semiconductor substrate. In block 624 of method 600, the trench is coated with a high-κ passivation layer and in block 626, the trench is filled with an oxide. In one example of block 624, trench 230 is coated with a high-κ passivation layer (not shown). In one example of block 624, the trench 430/530 is coated with high-κ passivation layer 436/536, respectively. In one example of block 626 and the trench 230 is filled with an oxide (not shown). In one example of block 626, trench 530 is filled with an oxide 538.

Figure 8:
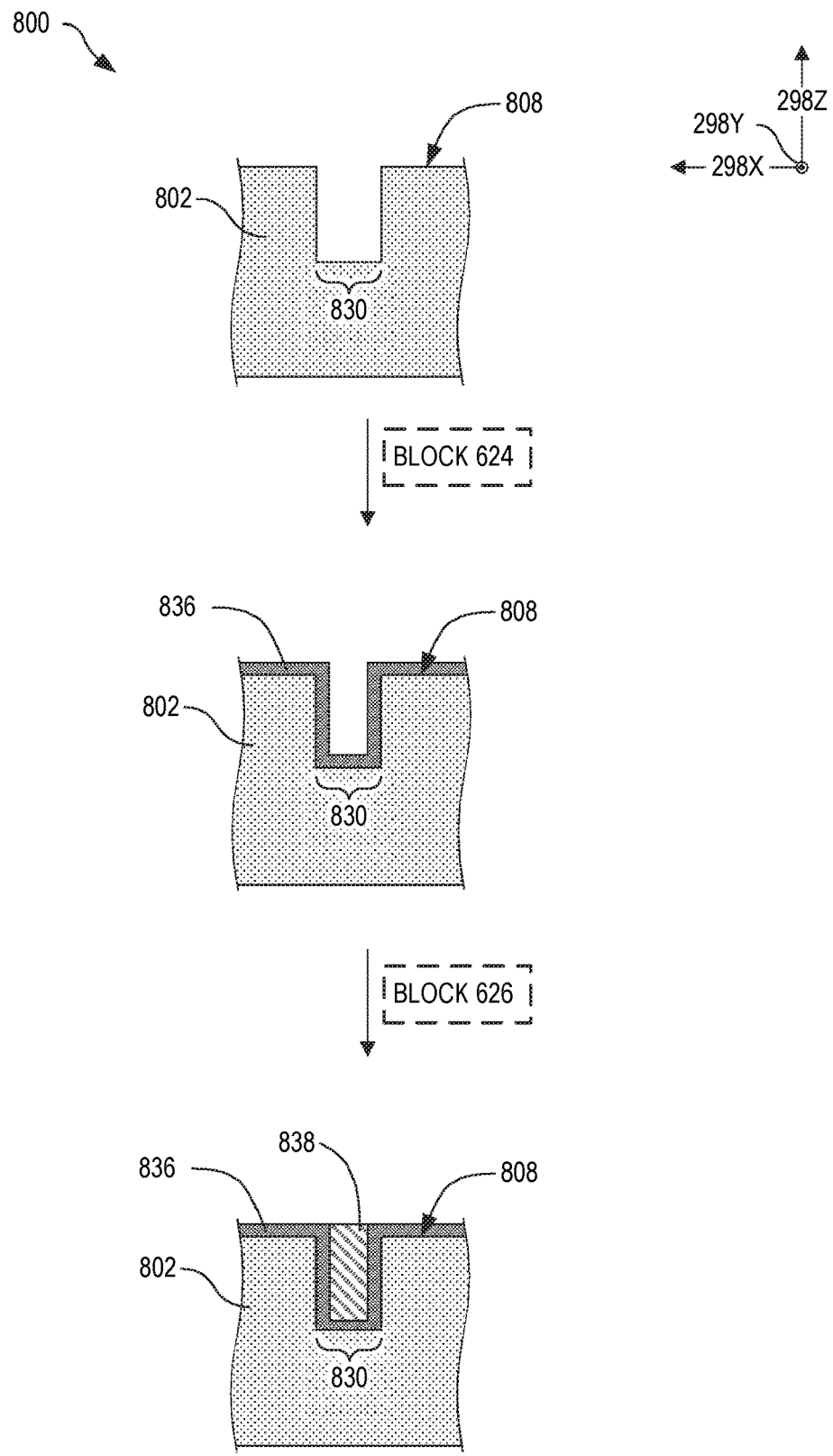
FIG. 8 illustrates one pixel-array substrate and intermediate substrates that result from the method of FIG. 6, according to an embodiment.

FIG. 8 shows cross-sectional views of semiconductor substrate 802, the views illustrating blocks of the method 600. The semiconductor substrate 802 of pixel-array substrate 800 has a trench 830. Block 624 coats the trench 830 with a high-κ passivation layer 836. Block 626 fills the trench 830 with an oxide 838.

Since the method 600 may be used in pixel-array substrates described previously, the description of respective components of pixel-array substrates discussed above with respect to FIGS. 1-5 applies to those elements of method 600 with like names. Furthermore, method 600 is not limited, unless otherwise specified or understood by those of ordinary skill in the art, to the order shown in FIG. 6.

Figure 9:
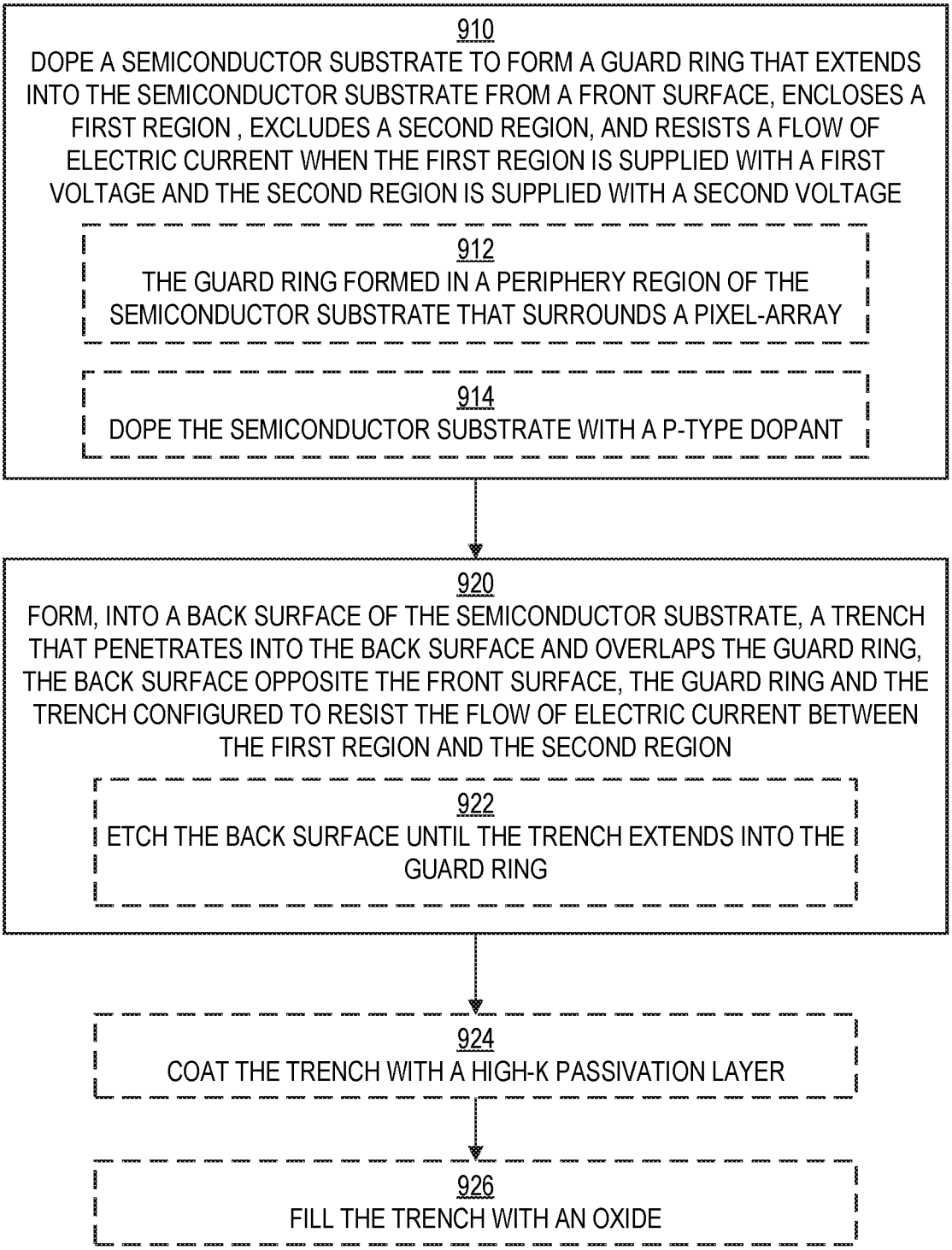
FIG. 9 illustrates one method for reducing leakage current between a first region and a second region of a pixel-array substrate, according to an embodiment.

FIG. 9 is a flowchart illustrating a method 900 for reducing leakage current across a pixel-array substrate between a first region and a second region. Method 900 may be used in conjunction with any of pixel-array substrates 200, 400, 500, 700 or 800. Method 900 includes blocks 910 and 920. In embodiments, method 900 also includes at least one of blocks 924 and 926.

In block 910 of method 900, a semiconductor substrate is doped to form a guard ring that extends into the semiconductor substrate from a front surface, encloses a first region, excludes a second region, and resists a flow of electric current when the first region is supplied with a first voltage and the second region is supplied with a second voltage. In one example of block 910, the semiconductor substrate 202 is doped to form the second guard ring 224.

In block 920 of method 900, a trench is formed into a back surface of the semiconductor substrate. The trench penetrates into the back surface and overlaps the guard ring. The guard ring and the trench are configured to resist the flow of electric current between the first region and the second region. In one example of block 920, the back surface 208 forms the second trench 234. In one example of block 920, the back surface 408/508 forms the trench 430/530. In one example of block 920, back surface 808 forms the trench 830.

Figure 10:
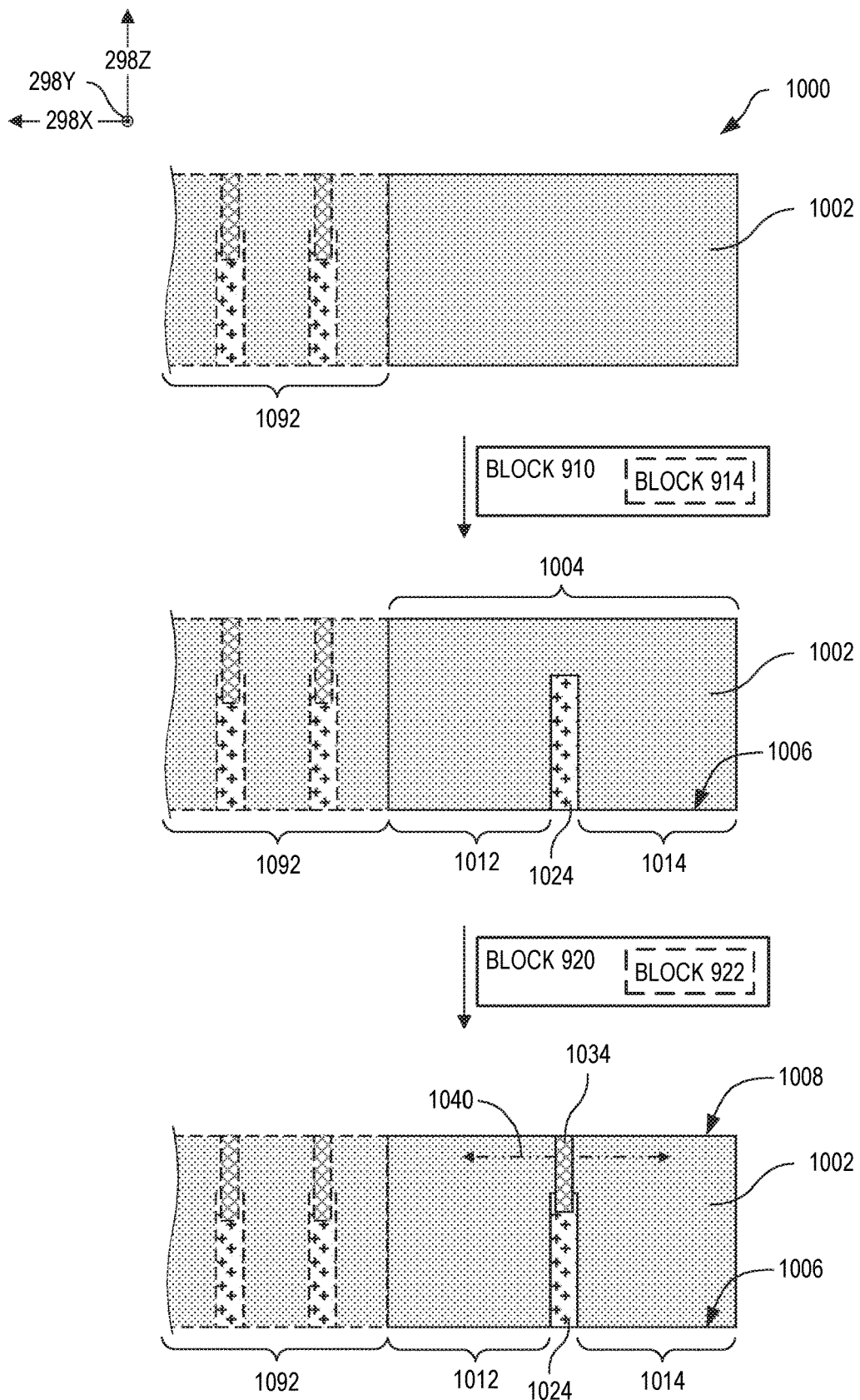
FIG. 10 illustrates one pixel-array substrate and intermediate substrates that result from the method of FIG. 9, according to an embodiment.

FIG. 10 shows cross-sectional views of semiconductor substrate 1002, the views illustrating blocks of the method 900. Using block 910, the semiconductor substrate 1002 of pixel-array substrate 1000 is doped to form a guard ring 1024 that extends into the semiconductor substrate 1002 from a front surface 1006, encloses a first region 1012, and excludes a second region 1014. Using block 920, the back surface 1008 of the semiconductor substrate 1002 is etched to form a trench 1034 that penetrates into the back surface 1008 and overlaps the guard ring 1024 in the horizontal plane. The back surface 1008 is opposite the front surface 1006 and the guard ring 1024 combined with the trench 1034 are configured to resist the flow of electric current 1040 between the first region 1012 and the second region 1014.

In certain embodiments, the method 900 includes one or more additional blocks of the flowchart in FIG. 9. In block 912 of method 900, the guard ring is formed in a periphery region of the semiconductor substrate that encloses a pixel array. In one example of block 912, second guard ring 224 is formed in the periphery region 204 of the pixel-array substrate 200 that encloses the pixel array 292 in the horizontal plane.

FIG. 10 illustrates one example of block 912 of method 900. In this example, guard ring 1024 is formed in the periphery region 1004 of the pixel-array substrate 1000 that encloses the pixel array 1092 in the horizontal plane.

In certain embodiments, the method 900 includes one or more additional blocks of the flowchart in FIG. 9. In block 914 of method 900, the semiconductor substrate is doped with a p-type dopant when forming the guard ring. In one example of block 914, the semiconductor substrate 202 is doped with a p-type dopant (not shown) to form the second guard ring 224.

FIG. 10 illustrates one example of block 914 of method 900. In this example, the semiconductor substrate 1002 of pixel-array substrate 1000 is doped with a p-type dopant to form the guard ring 1024, as is known in the art.

In certain embodiments, the method 900 includes one or more additional blocks of the flowchart in FIG. 9. In block 922 of method 900, the back surface of the semiconductor is etched until the trench extends into the guard ring. In one example of block 922, the back surface 208 of the semiconductor substrate 202 is etched until the second trench 234 extends into the second guard ring 224. In one example of block 922, the back surface 408/508 is etched until the trench 430/530 respectively extends into the guard ring (not shown). In one example of block 922, the back surface 808 of semiconductor substrate 802 is etched until the trench 830 extends into the guard ring (not shown).

FIG. 10 illustrates one example of block 922 of method 900. In this example, the back surface 1008 is etched until the trench 1034 extends into the guard ring 1024.

In certain embodiments, the method 900 includes one or more additional blocks of the flowchart in FIG. 9 that serve to further resist the flow of unwanted electric current though the semiconductor substrate. In block 924 of method 900, the trench is coated with a high-κ passivation layer and in block 926, the trench is filled with an oxide. In one example of block 924, second trench 234 is coated with a high-κ passivation layer (not shown). In one example of block 924, the trench 430/530 is coated with high-κ passivation layer 436/536, respectively. In one example of block 924, trench 730 is coated with a high-κ passivation layer (not shown). In one example of block 924, the trench 830 is coated with high-κ passivation layer 836. In one example of block 926 and the second trench 234 is filled with an oxide (not shown). In one example of block 926, trench 530 is filled with an oxide 538. In one example of block 926 and the trench 730 is filled with an oxide (not shown). In one example of block 926, trench 830 is filled with an oxide 838.

Figure 11:
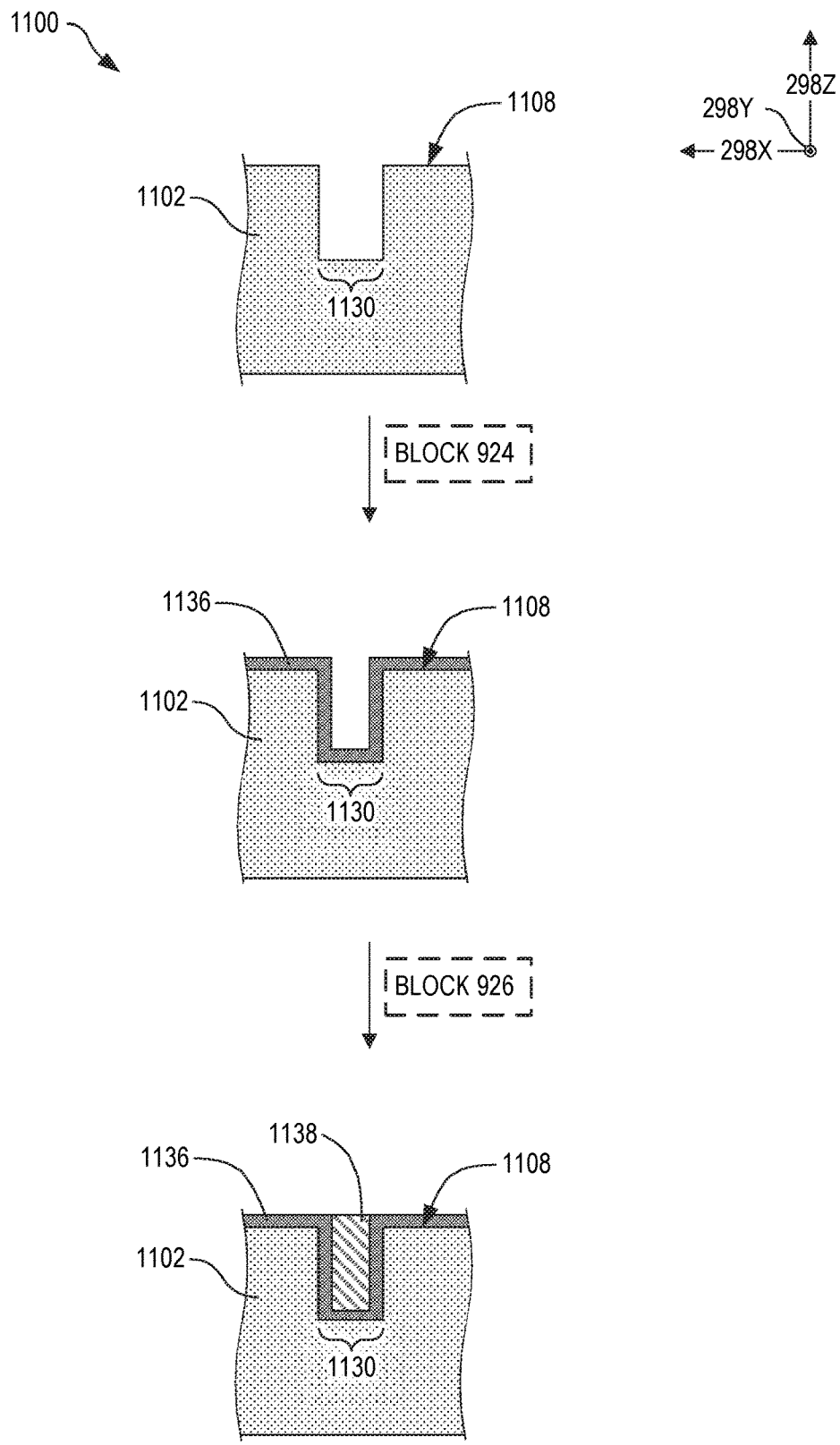
FIG. 11 illustrates one pixel-array substrate and intermediate substrates that result from the method of FIG. 9, according to an embodiment.

FIG. 11 illustrates one example of block 924 and block 926 of method 900. In this example, the semiconductor substrate 1102 of pixel-array substrate 1100 has a trench 1130. Block 924 cotes the trench 1130 with a high-κ passivation layer 1136. Block 926 fills the trench 1130 with an oxide 1138.

Since the method 900 may be used in pixel-array substrates described previously, the description of respective components of pixel-array substrates discussed above with respect to FIGS. 1-8 applies to those elements of method 900 with like names. Furthermore, method 900 is not limited, unless otherwise specified or understood by those of ordinary skill in the art, to the order shown in FIG. 9.

Combinations of Features

Features described above, as well as those claimed below, may be combined in various ways without departing from the scope hereof. The following enumerated examples illustrate some possible, non-limiting combinations:

(A1) In a first aspect, a pixel-array substrate includes: a semiconductor substrate that includes a pixel array, a back surface, and a front surface opposite the back surface; a guard ring formed of a doped semiconductor, enclosing the pixel array, and extending into the semiconductor substrate from the front surface; and the back surface forming a trench extending into the semiconductor substrate, the trench overlapping the guard ring.

(A2) In an embodiment of A1, the trench extends into the semiconductor substrate to a trench depth, the guard ring extends into the semiconductor substrate to a ring depth, the trench depth plus the ring depth being sufficiently long to exceed a substrate thickness of the semiconductor substrate.

(A3) In an embodiment of either one of A1 and A2, the guard ring is formed of a p-doped semiconductor.

(A4) An embodiment of any one of A1 through A3 further includes a second guard ring formed of a p-doped semiconductor that encloses the guard ring and extends into the semiconductor substrate from the front surface.

(A5) An embodiment of A4 further includes a second trench formed by the back surface that overlaps the second guard ring.

(A6) In an embodiment of A5, the second trench extends into the semiconductor substrate to a second trench depth, the second guard ring extends into the semiconductor substrate to a second ring depth, the second trench depth plus the second ring depth is sufficiently long to span the substrate thickness of the semiconductor substrate.

(A7) An embodiment of A6 further includes a third guard ring that encloses the guard ring and is enclosed by the second guard ring, the third guard ring extends into the semiconductor substrate from the front surface and is formed of an n-doped semiconductor material.

(A8) An embodiment of any one of A6 and A7 further includes a high-κ passivation layer on the back surface that lines the trench and the second trench.

(A9) An embodiment of any one of A6 through A8, the trench and the second trench being filled with an oxide.

(B1) In a second aspect, a method for reducing leakage current into a pixel-array of a pixel-array substrate including: doping a semiconductor substrate to form a guard ring that extends into the semiconductor substrate from a front surface, encloses a pixel array, excludes a periphery region, and resists a flow of electric current; and forming, into a back surface of the semiconductor substrate, a trench that penetrates into the back surface and overlaps the guard ring, the back surface is opposite to the front surface, the guard ring and the trench are configured to resist the flow of electric current between the pixel array and the periphery region.

(B2) In an embodiment of B1, forming the trench includes etching the back surface until the trench extends into the guard ring.

(B3) An embodiment of either one of B1 and B2 further includes coating the trench with a high-κ passivation layer.

(B4) An embodiment of any one of B1 through B3 further includes filling the trench with an oxide.

(B5) In an embodiment of any one of B1 through B4, said doping includes doping the semiconductor substrate with a p-type dopant.

(C1) In a third aspect, a method for reducing leakage current across a pixel-array substrate including: doping a semiconductor substrate to form a guard ring that extends into the semiconductor substrate from a front surface, encloses a first region of the semiconductor substrate, excludes a second region of the semiconductor substrate, and resists a flow of electric current when the first region is supplied with a first voltage and the second region is supplied with a second voltage; and forming, into a back surface of the semiconductor substrate, a trench that penetrates into the back surface and overlaps the guard ring, the back surface is the front surface, the guard ring and the trench configured to resist the flow of electric current between the first region and the second region.

(C2) In an embodiment of C1, doping includes forming the guard ring in a periphery region of the semiconductor substrate that surrounds a pixel-array.

(C3) In an embodiment of either one of C1 and C2, forming the trench includes etching the back surface until the trench extends into the guard ring.

(C4) An embodiment of any one of C1 through C3 further includes coating the trench with a high-κ passivation layer.

(C5) An embodiment of any of C1 through C4 further includes filling the trench with an oxide.

(C6) In an embodiment of any one of C1 through C5, said doping including doping the semiconductor substrate with a p-type dopant.

Any feature of the first, second, and third aspects described above are interchangeable with other of the described aspects, unless otherwise specified or understood by those of ordinary skill in the art.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A pixel-array substrate, comprising:
a semiconductor substrate including a pixel array including a plurality of pixels, a back surface and a front surface opposite the back surface;
a first guard ring being formed of a p-doped semiconductor, enclosing the pixel array, and extending into the semiconductor substrate from the front surface;
a second guard ring formed of a p-doped semiconductor, enclosing the first guard ring, and extending into the semiconductor substrate from the front surface; and
a third guard ring that encloses the first guard ring and is enclosed by the second guard ring, the third guard ring extending into the semiconductor substrate from the front surface and being formed of an n-doped semiconductor material,
the back surface forming (i) a first trench that extends into the semiconductor substrate, overlaps the first guard ring along a horizontal plane, and (ii) a second trench formed by the back surface and overlapping, along the horizontal plane, the second guard ring,
each of the first trench and the second trench being one or both of: (a) coated with a high-κ passivation layer and (b) filled with an oxide material;
the semiconductor substrate including (i) a first substrate region that surrounds the pixel array and spatially isolates each of the first guard ring and the first trench from the pixel array and regions between adjacent pixels of the plurality of pixels, (ii) a second substrate region that surrounds the first guard ring, and (iii) a third substrate region that surrounds the second guard ring.

2. The pixel-array substrate of claim 1, the first trench extending into the semiconductor substrate to a first trench depth, the first guard ring extending into the semiconductor substrate to a ring depth, the first trench depth plus the ring depth being sufficiently long to exceed a substrate thickness of the semiconductor substrate.

3. The pixel-array substrate of claim 1, the second trench extending into the semiconductor substrate to a second trench depth, the second guard ring extending into the semiconductor substrate to a second ring depth, the second trench depth plus the second ring depth being sufficiently long to span a substrate thickness of the semiconductor substrate.

4. The pixel-array substrate of claim 3, further comprising a high-κ passivation layer on the back surface and lining the first trench and the second trench.

5. The pixel-array substrate of claim 3, the first trench and the second trench being filled with an oxide.

6. The pixel-array substrate of claim 1, the third guard ring not overlapping, in a vertical plane, any trench extending from the back surface.

7. The pixel-array substrate of claim 1, the third guard ring coupled to a voltage supply.

8. The pixel-array substrate of claim 1, the semiconductor substrate also including a fourth substrate region that surrounds the third guard ring.

* * * * *